(12) United States Patent
Yonekura

(10) Patent No.: US 8,698,514 B2
(45) Date of Patent: Apr. 15, 2014

(54) ELECTRICAL CHARACTERISTIC MEASURING SUBSTRATE

(75) Inventor: Hiroshi Yonekura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 710 days.

(21) Appl. No.: 12/913,845

(22) Filed: Oct. 28, 2010

(65) Prior Publication Data

US 2011/0109332 A1    May 12, 2011

(30) Foreign Application Priority Data

Nov. 9, 2009    (JP) .................................. 2009-256093

(51) Int. Cl.
*G01R 27/08*    (2006.01)
*G01R 1/04*    (2006.01)
*G01R 1/24*    (2006.01)
*G01R 31/28*    (2006.01)

(52) U.S. Cl.
CPC .............. *G01R 27/08* (2013.01); *G01R 1/0408* (2013.01); *G01R 1/24* (2013.01); *G01R 31/2822* (2013.01)
USPC .................................................... 324/756.03

(58) Field of Classification Search
None
See application file for complete search history.

(56) References Cited

U.S. PATENT DOCUMENTS

| | | | |
|---|---|---|---|
| 5,631,573 A | 5/1997 | Ohno | |
| 7,175,736 B2* | 2/2007 | Sakayori | 156/309.6 |
| 8,212,154 B2* | 7/2012 | Kashiwakura | 174/262 |
| 2009/0056999 A1 | 3/2009 | Kashiwakura | |

FOREIGN PATENT DOCUMENTS

| | | | |
|---|---|---|---|
| CN | 1113604 A | 12/1995 | |
| CN | 1885054 A | 12/2006 | |
| CN | 101378633 A | 3/2009 | |
| DE | 3703030 A1 | 9/1988 | |
| EP | 2 197 073 A2 | 6/2010 | |
| JP | 63-136657 A | 6/1988 | |
| JP | 63-136657 A1 * | 6/1998 | .............. H01L 25/00 |
| JP | 11-330292 A1 * | 11/1999 | .............. H01L 23/12 |

OTHER PUBLICATIONS

Official Communication issued in corresponding European Patent Application No. 10188204.1, mailed on Jun. 25, 2012.

* cited by examiner

*Primary Examiner* — Jermele M Hollington
(74) *Attorney, Agent, or Firm* — Keating & Bennett, LLP

(57) ABSTRACT

An electrical characteristic measuring substrate includes a plurality of laminated dielectric layers, front-surface coplanar lines disposed at a front surface of the substrate, back-surface coplanar electrodes disposed at a back surface thereof, and interlayer ground electrodes disposed between dielectric layers. First ends of the front-surface coplanar lines define a front-surface component mounting electrode, and first ends of the back-surface coplanar lines define a back-surface component mounting electrode. The front-surface component mounting electrode and the back-surface component mounting electrode have substantially the same pattern when viewed from the direction perpendicular to the front surface. Each of the front-surface component mounting electrode and the back-surface component mounting electrode has an electrode pattern asymmetric about a substantially central line of the front surface or about that of the back surface.

5 Claims, 6 Drawing Sheets

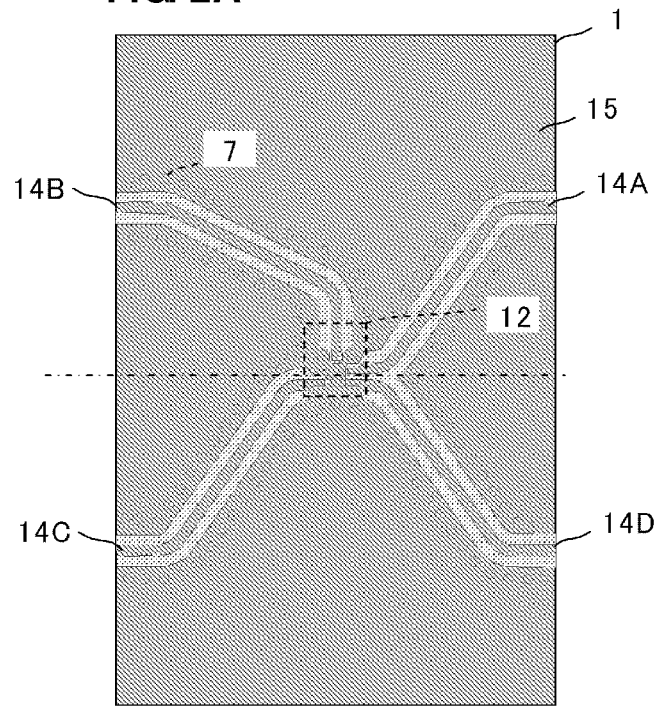
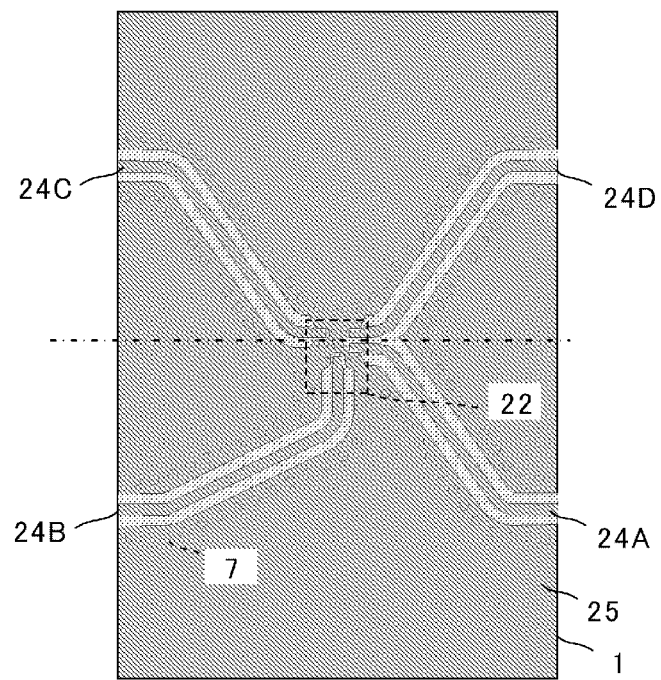

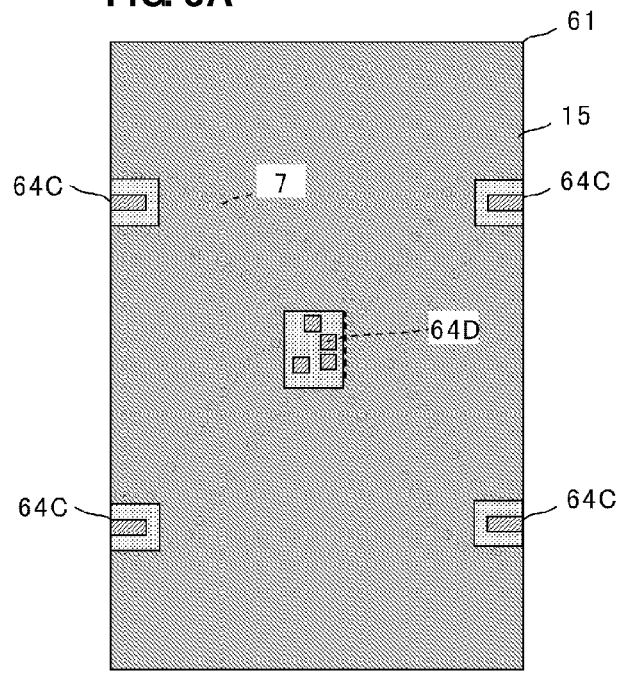
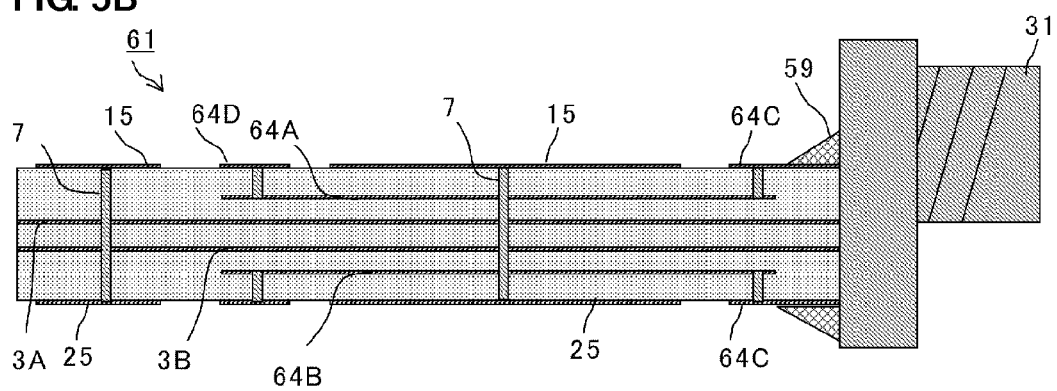

ELECTRICAL CHARACTERISTIC MEASURING SUBSTRATE

BACKGROUND OF THE INVENTION

1. Field of the Invention

The present invention relates to a substrate used to measure electrical characteristics of an electronic component while mounting the electronic component thereon and being connected to a measurement device during measurement.

2. Description of the Related Art

Electrical characteristics of electronic components, such as filters and duplexers, may often be measured to determine whether they are within specifications. Electrical characteristics of an electronic component can be measured by mounting the electronic component on a substrate used to measure electrical characteristics and connecting the substrate to a measurement device. One typical example of such a substrate is a configuration in which a component mounting electrode arranged to be connected to an output terminal of an electronic component thereon and a connector arranged to be connected to a measurement device are connected by a coplanar line having specific impedance. Electronic components have various sizes and different terminal locations, and it is necessary to prepare a substrate used to measure electrical characteristics so as to support each of various types of electronic components.

FIG. 1A is a plan view of a first configuration of a substrate used to measure electrical characteristics. A substrate 101 includes coplanar lines 104A to 104C, a front-surface ground electrode 105, a back-surface ground electrode (not illustrated), and via electrodes 107. The coplanar line 104A includes a first end that is arranged to be connected to an electronic component and that is arranged in a substantially central portion of the front surface of the substrate and a second end that is arranged to be connected to a connector arranged to be connected to a measurement device and that extends to a right side of the substrate illustrated in the drawing. The coplanar line 104B includes a first end arranged in the substantially central portion of the front surface of the substrate and a second end extending to a left side of the substrate. The coplanar line 104C includes a first end arranged in the substantially central portion of the front surface of the substrate and a second end extending to the left side of the substrate. The first ends of the coplanar lines 104A to 104C function as a component mounting electrode 102 to be connected to an output terminal of an electronic component. The front-surface ground electrode 105 extends over substantially the entire front surface of the substrate and is separated from the coplanar lines 104A to 104C. The back-surface ground electrode (not illustrated) extends over substantially the entire back surface of the substrate. The via electrodes 107 extend along the coplanar lines 104A to 104C and provide continuity between the front-surface ground electrode 105 and the back-surface ground electrode (not illustrated). The substrate 101 is used for a 3-port electronic component including terminals that are arranged substantially symmetric about a line.

FIG. 1B is a plan view of a second configuration of the substrate used to measure electrical characteristics. A substrate 201 includes coplanar lines 204A to 204D, a front-surface ground electrode 205, a back-surface ground electrode (not illustrated), and via electrodes 207. The coplanar line 204A includes a first end arranged in a substantially central portion of the front surface of the substrate and a second end extending to a right side of the substrate. The coplanar line 204B includes a first end arranged in the substantially central portion of the front surface of the substrate and a second end extending to a left side of the substrate. The coplanar line 204C includes a first end arranged in the substantially central portion of the front surface of the substrate and a second end extending to the left side of the substrate. The coplanar line 204D includes a first end arranged in the substantially central portion of the front surface of the substrate and a second end extending to the right side of the substrate. The first ends of the microstrip lines 204A to 204D function as a component mounting electrode 202 to be connected to an output terminal of an electronic component. The substrate 201 is used for a 4-port electronic component including terminals that are asymmetric about a line.

For electronic components, such as filters and duplexers, a plurality of types of substrates having terminals arranged as mirror images may be required. The substrate 101 in FIG. 1A is used for a plurality of types of electronic components including terminals that are substantially symmetric about a line. In contrast, because the substrate 201 illustrated in FIG. 1B is used for an electronic component including terminals that are asymmetric about a line, the substrate 201 illustrated in FIG. 1B cannot be used to measure electrical characteristics of another electronic component having terminals arranged as mirror images of those in that electronic component. Therefore, to measure electrical characteristics of each of two such electronic components, it is necessary to provide a different substrate for each of them. This results in an increased cost of production of substrates used to measure electrical characteristics and an increased number of items of inventory control.

SUMMARY OF THE INVENTION

To overcome the problems described above, preferred embodiments of the present invention provide an electrical characteristic measuring substrate that is capable of measuring electrical characteristics of two electronic components including terminals that are asymmetric about a line and being arranged as mirror images.

According to a preferred embodiment of the present invention, an electrical characteristic measuring substrate includes a plurality of laminated dielectric layers, a front-surface component mounting electrode, and a back-surface component mounting electrode. The front-surface component mounting electrode and the back-surface component mounting electrode have substantially the same pattern when viewed from a direction perpendicular to a front surface of the substrate or a direction perpendicular to a back surface of the substrate. The front-surface component mounting electrode is asymmetric with respect to a substantially central line of the front surface, and the back-surface component mounting electrode is asymmetric with respect to a substantially central line of the back surface. The front-surface component mounting electrode is disposed on the front surface of the substrate and enables an electronic component to be mounted thereon. The back-surface component mounting electrode is disposed at the back surface of the substrate and enables an electronic component to be mounted thereon.

With this configuration, to measure electrical characteristics of two electronic components having asymmetric terminals arranged as mirror images, one electronic component can be mounted on the front surface of the substrate and the other electronic component can be mounted on the back surface of the substrate. That is, electrical characteristics of two electronic components arranged as mirror images can be measured using a common electrical characteristic measuring substrate. Accordingly, electrical characteristics of two electronic components can be measured using a single electrical characteristic measuring substrate, and a reduced cost of production of substrates and a reduced number of items of inventory control of substrates are achieved.

The electrical characteristic measuring substrate may preferably further include at least one interlayer ground electrode, a plurality of front-surface lines, and a plurality of back-surface lines. The plurality of front-surface lines and the plurality of back-surface lines may preferably have substantially the same pattern when viewed from the direction perpendicular to the front surface or the direction perpendicular to the back surface. The at least one interlayer ground electrode may preferably be disposed between the dielectric layers of the substrate. The plurality of front-surface lines may preferably be arranged closer to the front surface of the substrate than to the at least one interlayer ground electrode and be connected to the front-surface component mounting electrode. The plurality of back-surface lines may preferably be arranged closer to the back surface of the substrate than to the at least one interlayer ground electrode and be connected to the back-surface component mounting electrode.

The at least one interlayer ground electrode in the electrical characteristic measuring substrate may preferably include a first interlayer ground electrode arranged to face the plurality of front-surface lines and a second interlayer ground electrode arranged to face the plurality of back-surface lines. The first interlayer ground electrode and the second interlayer ground electrode may preferably be arranged at different interfaces of the dielectric layers.

With this configuration, the front-surface lines and the first interlayer ground electrode define a transmission path, and the back-surface lines and the second interlayer ground electrode define a transmission path. The two transmission paths can be radio-frequency separated by arranging the first interlayer ground electrode and the second interlayer ground electrode in different interfaces of the dielectric layers, and degradation of the characteristics of the transmission paths is reduced.

The electrical characteristic measuring substrate may further include another interlayer ground electrode disposed between the dielectric layers between the first interlayer ground electrode and the second interlayer ground electrode.

Another interlayer ground electrode disposed between the two transmission paths can reliably radio-frequency separate the two transmission paths, and degradation of the characteristics of the transmission paths is further reduced.

In the electrical characteristic measuring substrate, the plurality of front-surface lines may preferably be disposed at the front surface of the substrate, and the plurality of back-surface lines may preferably be disposed at the back surface of the substrate. The substrate may further preferably include a surface ground electrode arranged adjacent to each of the plurality of front-surface lines and the plurality of back-surface lines and a via electrode that provides continuity between the surface ground electrode at each of the front surface and the back surface and the at least one interlayer ground electrode.

A via electrode arranged so as to pass through from the front surface to the back surface reduces the total number of via electrodes and reduces the cost of production of electrical characteristic measuring substrates.

With various preferred embodiments of the present invention, because the front-surface component mounting electrode and the back-surface component mounting electrode are arranged so as to be substantially the same pattern when viewed from the direction perpendicular to the surface, electrical characteristics of two types of electronic components having terminals arranged as mirror images can be measured by a single electrical characteristic measuring substrate. Accordingly, a reduced cost of production of substrates and a reduced number of items of inventory control of substrates are achieved.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A and 2B illustrate an example of an electrical characteristic measuring substrate according to a first preferred embodiment of the present invention.

FIGS. 5A and 5B illustrate an example of an electrical characteristic measuring substrate according to a third preferred embodiment of the present invention.

DETAILED DESCRIPTION OF THE PREFERRED EMBODIMENTS

An example of an electrical characteristic measuring substrate according to a first preferred embodiment of the present invention is described below.

FIG. 2A is a plan view of a front surface of an electrically characteristic measuring substrate 1. FIG. 2B is a plan view of a back surface of the electrical characteristic measuring substrate 1.

Figure 1A:
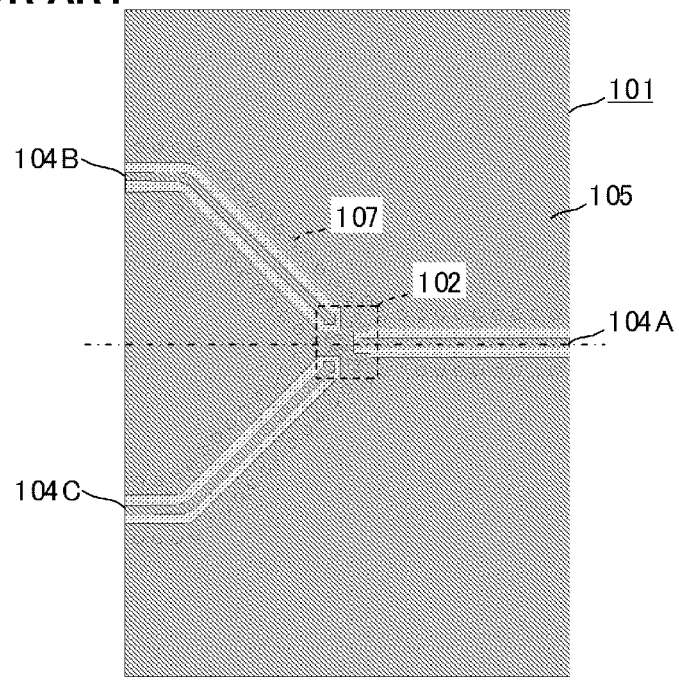
FIGS. 1A and 1B illustrate examples of a traditional electrical characteristic measuring substrate.
Figure 1B:
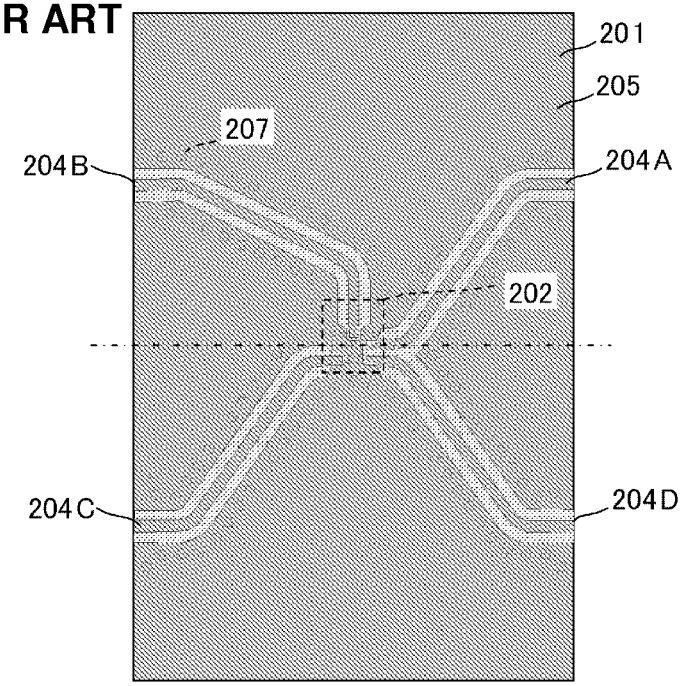
Figure 3A:
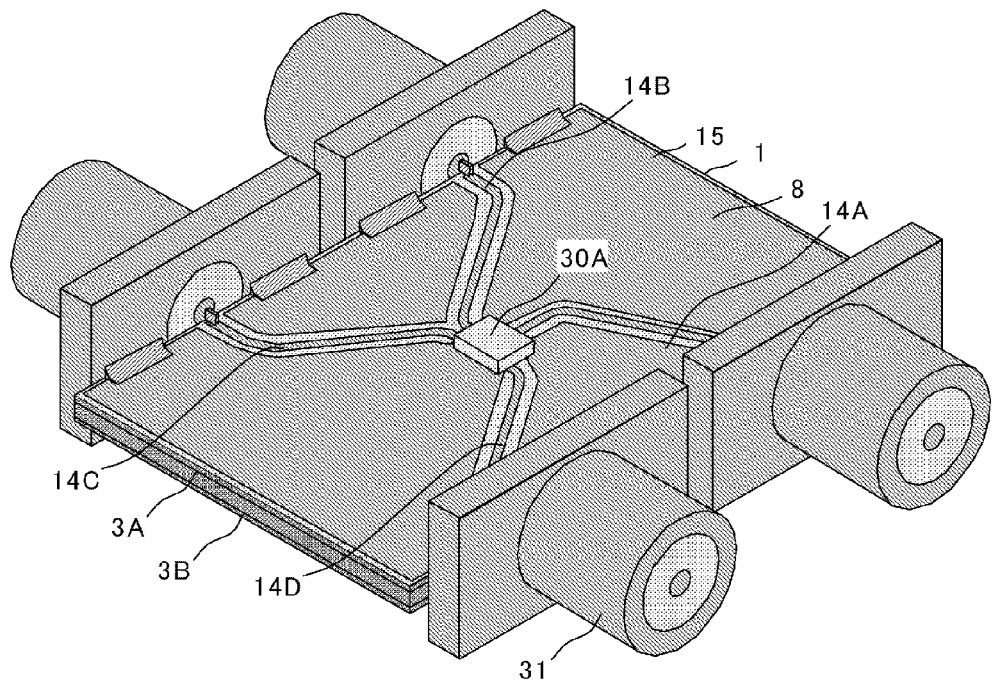
FIGS. 3A and 3B are perspective views of the electrical characteristic measuring substrate illustrated in FIGS. 2A and 2B.
Figure 3B:
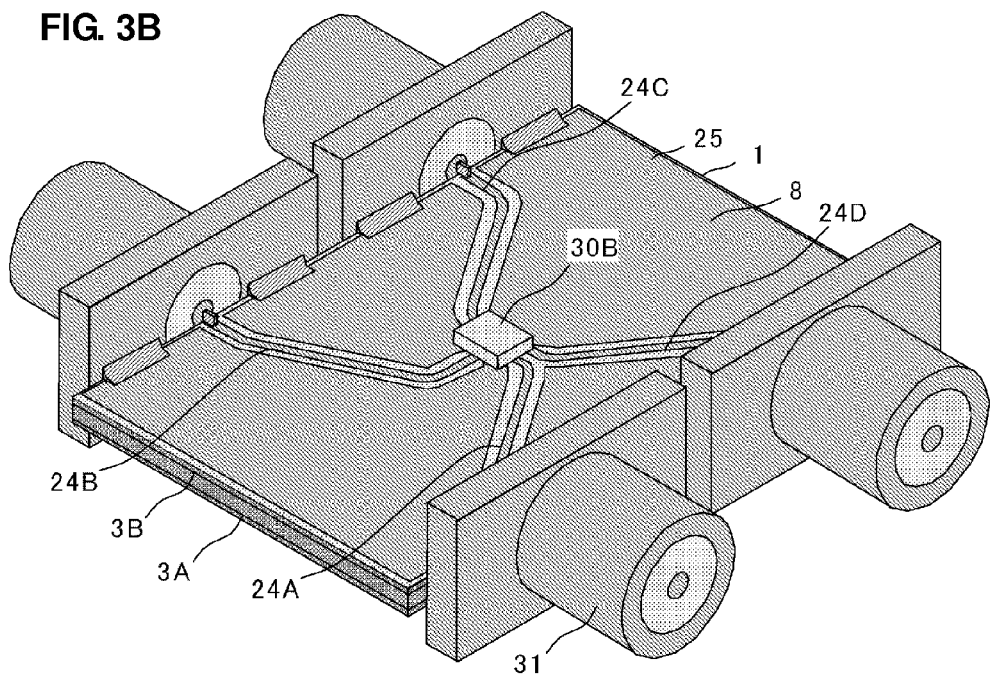

The electrical characteristic measuring substrate 1 preferably is a laminated substrate preferably including three laminated dielectric layers and including coplanar lines 14A to 14D and 24A to 24D, a front-surface ground electrode 15, a back-surface ground electrode 25, via electrodes 7, and interlayer ground electrodes 3A and 3B (see FIGS. 3A and 3B). The coplanar line 14A includes a first end that is arranged to be connected to an electronic component and that is arranged in a substantially central portion of a front surface of the substrate 1 and a second end that is arranged to be connected to a connector to be connected to a measurement device and that extends to a right side of the substrate 1. The coplanar line 14B includes a first end arranged in the substantially central portion of the front surface of the substrate 1 and a second end extending to a left side of the substrate 1. The coplanar line 14C includes a first end arranged in the substantially central portion of the front surface of the substrate 1 and a second end extending to the left side of the substrate 1. The coplanar line 14D includes a first end arranged in the substantially central portion of the front surface of the substrate 1 and a second end extending to the right side of the substrate 1. The coplanar lines 14A to 14D correspond to front-surface lines according to preferred embodiments of the present invention, and their first ends function as a front-surface component mounting electrode 12 to be connected to an output terminal of an electronic component.

The coplanar line 24A includes a first end arranged in a substantially central portion of the back surface of the substrate 1 and a second end extending a right side of the substrate 1. The coplanar line 24B includes a first end arranged in the substantially central portion of the back surface and a second end extending to a left side of the substrate 1. The coplanar line 24C includes a first end arranged in the substantially central portion of the back surface and a second end extending to the left side of the substrate 1. The coplanar line 24D includes a first end arranged in the substantially central portion of the back surface and a second end extending to the right side of the substrate 1. The coplanar lines 24A to 24D correspond to back-surface lines according to preferred embodiments of the present invention, and their first ends function as a back-surface component mounting electrode 22 to be connected to an output terminal of an electronic component.

The front-surface ground electrode 15 extends over substantially the entire front surface of the substrate 1 other than the coplanar lines 14A to 14D and both of their sides. The back-surface ground electrode 25 extends over substantially the entire back surface of the substrate 1 other than the coplanar lines 24A to 24D and both of their sides. The interlayer ground electrodes 3A and 3B are positioned at different interfaces of the dielectric layers and extend over substantially the entire surfaces of their respective interfaces. The front-surface ground electrode 15, the interlayer ground electrode 3A, and the coplanar lines 14A to 14D define a coplanar transmission path at the front surface of the electrical characteristic measuring substrate 1. The back-surface ground electrode 25, the interlayer ground electrode 3B, and the coplanar lines 24A to 24D define a coplanar transmission path at the back surface of the electrical characteristic measuring substrate 1.

The pattern of the coplanar lines 14A to 14D and the front-surface ground electrode 15 and the pattern of the coplanar lines 24A to 24D and the back-surface ground electrode 25 preferably have substantially the same shape when viewed from the direction perpendicular to the front surface (or the direction perpendicular to the back surface). The via electrodes 7 extend along the coplanar lines 14A to 14D and 24A to 24D and provide continuity between the front-surface ground electrode 15 and the back-surface ground electrode 25. The via electrodes 7 are preferably made of a common pattern at the front surface and the back surface. Thus, the total number of the via electrodes 7 can be reduced as compared with a case in which two electrical characteristic measuring substrates are prepared, and a reduced cost of production is achieved.

FIGS. 3A and 3B are perspective views of the electrical characteristic measuring substrate 1.

To measure electrical characteristics of a first 4-port electronic component 30A including terminals being asymmetric about a line using the electrical characteristic measuring substrate 1, as illustrated in FIG. 3A, the first 4-port electronic component 30A is mounted on the front-surface component mounting electrode 12 (not illustrated). Four coaxial connectors 31 are attached to the right side and the left side of the electrical characteristic measuring substrate 1. The coplanar lines 14A to 14D are connected to a measurement device with substantially central conductors of the coaxial connectors 31 disposed therebetween. The front-surface ground electrode 15 is connected to a ground with external conductors of the coaxial connectors 31 disposed therebetween.

To measure electrical characteristics of a second 4-port electronic component 30B including terminals arranged as mirror images of those in the first 4-port electronic component 30A using the electrical characteristic measuring substrate 1, as illustrated in FIG. 3B, the second 4-port electronic component 30B is mounted on the back-surface component mounting electrode 22 (not illustrated). The coaxial connectors 31 are attached to the right side and the left side of the electrical characteristic measuring substrate 1 such that they are inverted. The coplanar lines 24A to 24D are connected to a measurement device with substantially central conductors of the coaxial connectors 31 disposed therebetween. The back-surface ground electrode 25 is connected to a ground with external conductors of the coaxial connectors 31 disposed therebetween.

For the electrical characteristic measuring substrate 1, the component mounting electrode 12 disposed at the front surface and the component mounting electrode 22 disposed at the back surface preferably have substantially the same pattern when viewed from the direction perpendicular to the front surface (or the direction perpendicular to the back surface). Accordingly, electrical characteristics of two types of electronic components 30A and 30B including terminals arranged as mirror images can be measured using the single electrical characteristic measuring substrate 1. Thus, a reduced cost of production of substrates and a reduced number of items of inventory control of substrates are achieved.

Figure 4A:
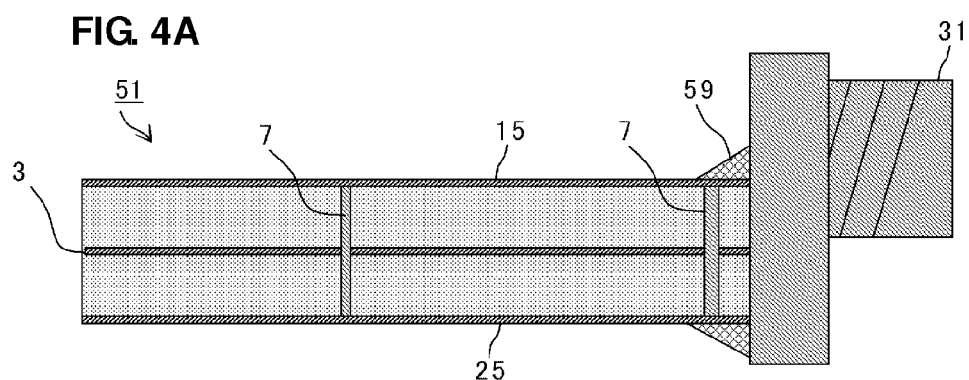
FIGS. 4A and 4B illustrate examples of an electrical characteristic measuring substrate according to a second preferred embodiment of the present invention.

Next, examples of an electrical characteristic measuring substrate according to a second preferred embodiment of the present invention will be described. FIG. 4A is a schematic side sectional view of an electrical characteristic measuring substrate 51. The electrical characteristic measuring substrate 51 includes electrodes preferably having substantially the same shape in plan view as those of the electrical characteristic measuring substrate 1. The electrical characteristic measuring substrate 51 is a laminated substrate including two laminated dielectric layers and the front-surface ground electrode 15, the back-surface ground electrode 25, and an interlayer ground electrode 3. Even with only one interlayer ground electrode, preferred embodiments of the present invention can be achieved. The coaxial connectors 31 and the electrical characteristic measuring substrate 51 are preferably bonded by solder 59, for example. However, any other suitable bonding method to bond the connectors and the substrate together may be used.

Figure 4B:
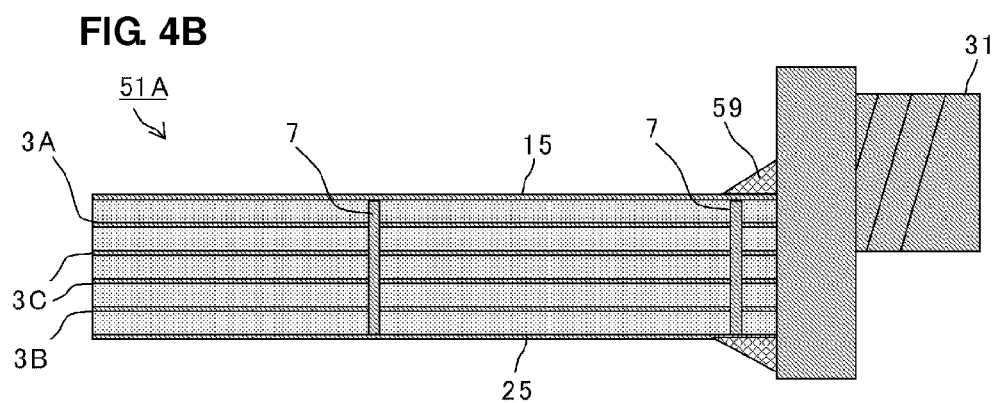

Next, a modified example of the electrical characteristic measuring substrate according to the present preferred embodiment is described. FIG. 4B is a schematic side sectional view of an electrical characteristic measuring substrate 51A. The electrical characteristic measuring substrate 51A preferably is a laminated substrate preferably including five laminated dielectric layers. In contrast to the above-described electrical characteristic measuring substrate 51, the electrical characteristic measuring substrate 51A includes the interlayer ground electrode 3A arranged to face the coplanar lines 14A to 14D and the interlayer ground electrode 3B arranged to face the coplanar lines 24A to 24D. The interlayer ground electrodes 3A and 3B are arranged at different interfaces of the dielectric layers. The interlayer ground electrode 3A and the interlayer ground electrode 3B correspond to a first interlayer ground electrode and a second interlayer ground electrode, respectively, according to preferred embodiments of the present invention. The electrical characteristic measuring substrate 51A further includes interlayer ground electrodes 3C disposed between the interlayer ground electrodes 3A and 3B. With this configuration, the coplanar lines 14A to 14D and the coplanar lines 24A to 24D can be more reliably radio-frequency separated.

Next, an example of an electrical characteristic measuring substrate according to a third preferred embodiment of the present invention is described. FIG. 5A is a plan view of an electrical characteristic measuring substrate 61. FIG. 5B is a schematic side sectional view of the electrical characteristic measuring substrate 61.

The electrical characteristic measuring substrate 61 preferably is a laminated substrate preferably including five laminated dielectric layers and includes the front-surface ground electrode 15, the back-surface ground electrode 25, strip lines 64A and 64B, connector connecting electrodes 64C, component mounting electrodes 64D, and the interlayer ground electrodes 3A and 3B. The front-surface ground electrode 15 is disposed at the front surface. The strip line 64A is disposed between the dielectric layer of the front surface and the second dielectric layer. The interlayer ground electrode 3A is disposed between the second dielectric layer and the third dielectric layer. The interlayer ground electrode 3B is disposed between the third dielectric layer and the fourth dielectric layer. The strip line 64B is disposed between the fourth dielectric layer and the dielectric layer of the back surface. The back-surface ground electrode 25 is disposed at the back surface. The opposite ends of the strip line 64A are connected to the component mounting electrodes 64D and the connector connecting electrodes 64C disposed at the front surface with the via electrodes disposed therebetween. The opposite ends of the strip line 64B are connected to the component mounting electrodes 64D and the connector connecting electrodes 64C disposed at the back surface with the via electrodes disposed therebetween.

With this configuration, the component mounting electrodes 64D disposed at the front surface and at the back surface preferably have substantially the same pattern when viewed from the direction perpendicular to the front surface (or the direction perpendicular to the back surface). Thus, electrical characteristics of two types of electronic components including terminals arranged as mirror images can be measured by the electrical characteristic measuring substrate 61. Accordingly, a reduced cost of production of substrates and a reduced number of items of inventory control of substrates are achieved.

The strip line 64A and the strip line 64B preferably have substantially the same line pattern when viewed from the direction perpendicular to the front surface (or the direction perpendicular to the back surface). Therefore, a reduced number of the via electrodes 7 disposed along the strip lines 64A and 64B and passing through the substrate 61 can be achieved.

Next, examples of an electrical characteristic measuring substrate according to other preferred embodiments of the present invention are described.

Figure 6A:
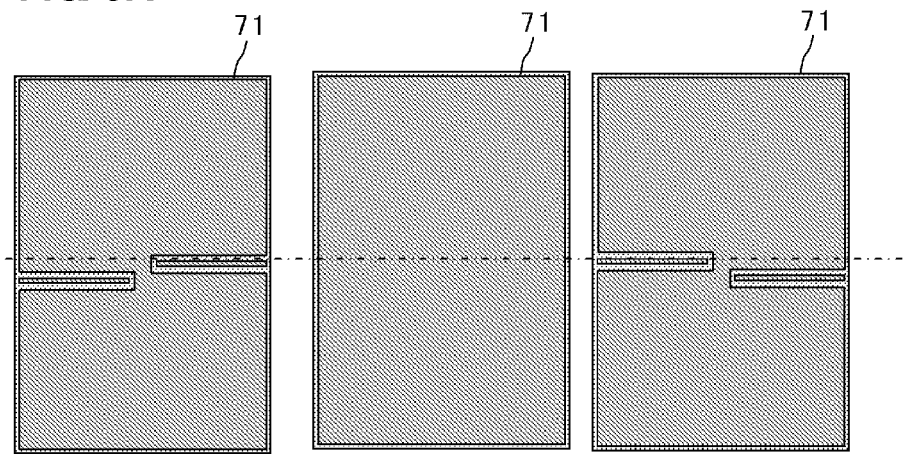
FIGS. 6A and 6B illustrate examples of an electrical characteristic measuring substrate according to other preferred embodiments of the present invention.

FIG. 6A is an exploded view of an electrical characteristic measuring substrate 71 and illustrates a front surface on the left, an interlayer of dielectric layers in the middle, and a back surface on the right.

The electrical characteristic measuring substrate 71 preferably has a 2-port configuration. For electronic components having electrical characteristics to be measured by the electrical characteristic measuring substrate 71, it may be preferable that each of the electronic components includes two output terminals and that there be a plurality of types of electronic components having terminals arranged as mirror images.

Figure 6B:
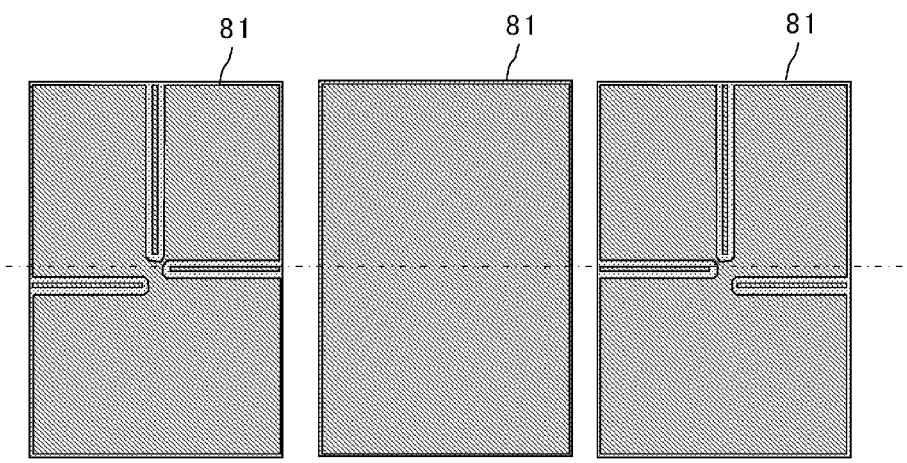

FIG. 6B is an exploded view of an electrical characteristic measuring substrate 81 and illustrates a front surface on the left, an interlayer of dielectric layers in the middle, and a back surface on the right.

The electrical characteristic measuring substrate is a 3-port configuration. For electronic components having electrical characteristics to be measured by the electrical characteristic measuring substrate 81, it may be preferable that each of the electronic components includes three output terminals and that there be a plurality of types of electronic components having terminals positioned as mirror images.

As illustrated above, the electrical characteristic measuring substrate according to preferred embodiments of the present invention can be achieved as long as it includes a line pattern asymmetric about a substantially central line of a front surface and a back surface of the substrate and supports a plurality of ports.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electrical characteristic measuring substrate comprising:
    a substrate including a plurality of laminated dielectric layers;
    a front-surface component mounting electrode disposed at a front surface of the substrate and arranged to enable an electronic component to be mounted thereon; and
    a back-surface component mounting electrode disposed at a back surface of the substrate and arranged to enable an electronic component to be mounted thereon; wherein
    the front-surface component mounting electrode and the back-surface component mounting electrode have substantially the same pattern when viewed from a direction perpendicular to the front surface or a direction perpendicular to the back surface;
    the front-surface component mounting electrode is asymmetric with respect to a substantially central line of the front surface that extends along a plane of the front surface of the substrate and that is parallel to a first pair of sides of the substrate and perpendicular to a second pair of sides of the substrate; and
    the back-surface component mounting electrode is asymmetric with respect to a substantially central line of the back surface that extends along a plane of the back surface of substrate and that is parallel to the first pair of sides of the substrate and perpendicular to the second pair of sides of the substrate.

2. The electrical characteristic measuring substrate according to claim 1, further comprising:
    at least one interlayer ground electrode disposed between the dielectric layers of the substrate;
    a plurality of front-surface lines being arranged closer to the front surface of the substrate than to the at least one interlayer ground electrode and being connected to the front-surface component mounting electrode; and
    a plurality of back-surface lines being arranged closer to the back surface of the substrate than to the at least one interlayer ground electrode and being connected to the back-surface component mounting electrode; wherein
    the plurality of front-surface lines and the plurality of back-surface lines have substantially the same pattern when viewed from the direction perpendicular to the front surface or the direction perpendicular to the back surface.

3. The electrical characteristic measuring substrate according to claim 2, wherein
    the at least one interlayer ground electrode comprises a first interlayer ground electrode arranged to face the plurality of front-surface lines and a second interlayer ground electrode arranged to face the plurality of back-surface lines; and the first interlayer ground electrode and the second interlayer ground electrode are positioned at different interfaces of the dielectric layers.

4. The electrical characteristic measuring substrate according to claim 3, further comprising:

another interlayer ground electrode disposed between the first interlayer ground electrode and the second interlayer ground electrode.

5. The electrical characteristic measuring substrate according to claim 2, wherein the plurality of front-surface lines is disposed at the front surface of the substrate, and the plurality of back-surface lines is disposed at the back surface of the substrate;

the substrate further comprising:

a surface ground electrode disposed adjacent to each of the plurality of front-surface lines and the plurality of back-surface lines; and a via electrode connecting the surface ground electrode to the at least one interlayer ground electrode.

* * * * *